US 6,995,088 B2

(12) United States Patent
Aggarwal et al.

(10) Patent No.: US 6,995,088 B2
(45) Date of Patent: Feb. 7, 2006

(54) SURFACE TREATMENT OF COPPER TO IMPROVE INTERCONNECT FORMATION

(75) Inventors: Sanjeev Aggarwal, Plano, TX (US); Lindsey Hall, Plano, TX (US); Trace Q. Hurd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/848,219

(22) Filed: May 18, 2004

(65) Prior Publication Data

US 2005/0260853 A1     Nov. 24, 2005

(51) Int. Cl.
*H01L 21/44*     (2006.01)
(52) U.S. Cl. .................. 438/687; 438/679
(58) Field of Classification Search ........... 438/687, 438/680, 681, 679, 691, 692, 694, 695
See application file for complete search history.

(56) References Cited

U.S. PATENT DOCUMENTS

| | | | | |
|---|---|---|---|---|
| 6,443,814 B1 * | 9/2002 | Miller et al. | ............ | 451/41 |
| 6,464,568 B2 * | 10/2002 | Miller et al. | ............ | 451/41 |
| 6,534,117 B1 * | 3/2003 | Yoshio et al. | ............ | 427/97.2 |
| 6,719,614 B2 * | 4/2004 | Miller et al. | ............ | 451/41 |

OTHER PUBLICATIONS

J.M. Bastidas, et al.; "Copper Corrosion Mechanism in the Presence of Formic Acid Vapor for Short Exposure Times"; Journal of The Electrochemical Society, 147 (3); pp. 999-1005.
E. Cano, et al; "Study of the Effect of Acetic Acid Vapor on Copper Corrosion at 40 and 80 % Relative Humidity"; Journal of The Electrochemical Society, 148 (11); pp. B431-B437.

* cited by examiner

*Primary Examiner*—David Nhu
(74) *Attorney, Agent, or Firm*—Peter K. McLarty; W. James Brady, III; Frederick J. Telecky, Jr.

(57) ABSTRACT

The present invention provides, in one embodiment, a method of forming a copper layer (100) over a semiconductor substrate (105). The method comprises coating a copper seed layer (110) located over a semiconductor substrate with a protective agent (120) to form a protective layer (125). The method also includes placing the semiconductor substrate in an acid bath (145) to remove the protective layer. The method further includes electrochemically depositing a second copper layer (155) on the copper seed layer. Such methods and resulting conductive structures thereof may be advantageously used in methods to manufacture integrated circuits comprising copper interconnects.

21 Claims, 8 Drawing Sheets

SURFACE TREATMENT OF COPPER TO IMPROVE INTERCONNECT FORMATION

TECHNICAL FIELD OF THE INVENTION

The present invention is directed, in general, to manufacture of semiconductor devices and more specifically to a method for forming a copper interconnect structure.

BACKGROUND OF THE INVENTION

The push to sub-0.18 micron multilevel metallized interconnections, such as lines, via, and trenches, and the desire to produce faster semiconductor devices, has resulted in a shift toward the use of copper for making electrical interconnections in ultra-large scale integration circuits. The deposition of copper interconnects are not without difficulties, however. For example, when copper is etched, it tends to be redeposited elsewhere on the semiconductor device, or on the processing chamber. Copper atoms also readily diffuse into silicon-containing dielectric layers. The contamination by copper in unwanted locations can degrade or destroy the performance of active devices in integrated circuits. One approach to reducing the problems with copper etching and diffusion, is the deposition of an underlying barrier layer to block the migration of copper atoms into other components of the semiconductor. To facilitate the adhesion of copper to the diffusion barrier, a seed layer of copper is deposited over the diffusion barrier, followed by the deposition of a second thicker copper conducting layer over the copper seed layer.

Typically, the copper seed layer is deposited on a semiconductor wafer by a vacuum process, such as physical vapor deposition (PVD) or chemical vapor deposition (CVD). The thick copper conducting layer is deposited by a wet process, such as electrochemical deposition (ECD). Because the deposit of the seed layer and thick conducting layer involve two distinct processes and tools, the wafer has to be removed from the copper seed layer depositing tool, exposed to the atmosphere for a period, and then placed in the tool for depositing the thick layer. Backlogs and mismatches in the machine times for seed layer and thick layer deposition can extend the time window where the wafer is exposed to the atmosphere to several hours.

During this time window, the surface of the seed layer surface oxidizes. In addition, atmospheric molecular contaminants (AMCs) containing hydrocarbons can form on the seed layer. The presence of irregular oxide or AMCs deposits on the copper seed layer can result in thinning or dissolution of the copper seed layer when placed in acidic electroplating solutions used for ECD. The resulting discontinuities in the seed layer exacerbate the formation of voids in the thick conducting layer during electroplating, thereby negatively impacting device performance and reliability. In addition, the oxide deposits may not be fully removed during ECD. The continued presence of an oxide deposits between the seed layer and the thick conducting layer weakens adhesion between these layers, making the interconnection more prone to mechanical failure. The current practice is to therefore minimize copper oxidation and organic compound contamination by restricting the period (e.g., a maximum of about 2 hours) between depositing the seed layer and thicker conducting layer by ECD processes. This approach, however can still result in unacceptably high oxidation and increased cycle times and therefore increased costs.

Previous approaches to mitigate copper oxidation and AMCs are imperfect, because there can still be defective devices with degraded device performance generated or increased costs for device manufacture. One approach is to store the partially completed semiconductor wafers having the seed layer in a holding room whose air is filtered of AMCs. Maintaining a holding room is expensive, however, and does not prevent oxidation. Another approach has been to store the partially completed semiconductor wafers in a nitrogen-purged box. This is also a costly solution and results in additional logistical cost. Still another approach is to clean the copper seed layer with sulphuric acid prior to ECD. Pre-cleaning with sulphuric acid, however, also can etch away the copper seed layer at an undesirably high rate (e.g., over 4 nm/min). This can cause the total removal of the portions of the copper seed layer which, in turn, results in defective devices. Moreover, if the time window were to unexpectedly increase, for instance, due to the lack of availability of the ECD tool, then sulphuric acid pre-cleaning would not likely be repeated out of concern that the copper seed layer would be entirely removed.

Accordingly, what is needed in the art is a method of making copper interconnections that do not exhibit the limitations of the prior art.

SUMMARY OF THE INVENTION

To address the above-discussed deficiencies of the prior art, the present invention provides a method of forming a copper layer over a semiconductor substrate. The method comprises coating a copper seed layer located over a semiconductor substrate with a protective agent to form a protective layer. The method also includes placing the semiconductor substrate in an acid bath to remove the protective layer, and electrochemically depositing a second copper layer on the copper seed layer.

In another embodiment, the present invention provides a method of manufacturing an integrated circuit. The method includes forming an active device on a semiconductor substrate and forming a copper interconnect on a dielectric layer located over the active device. Forming the copper interconnect includes forming a copper layer over the semiconductor substrate, as described above. The method of manufacturing the integrated circuit also includes connecting the interconnect with the active device to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes, for the first time, the advantages of coating a copper seed layer with a protective agent to form a protective layer. The protective layer prevents the formation of irregular oxide and AMC deposits on the copper seed layer. This allows a more uniform electrochemical deposition of a second thicker copper layer on the copper seed layer. Even lengthy time windows (e.g., greater than about 2 hours) between forming the copper seed layer and the second copper layer are allowable. Moreover, the protective agent either does not etch, or only slowly etches, the copper seed layer. Consequently, the protective layer can be formed on the copper seed layer multiple times without fear that the copper seed layer will be entirely removed. Additionally, the protective layer is easily removed by exposure to an acid before or during the ECD process. Although discussed in the context of forming copper interconnections, the present invention could be equally applied to any situation where it is desirable to protect against the formation of oxide or AMC deposits on a copper layer.

Figure 1A:
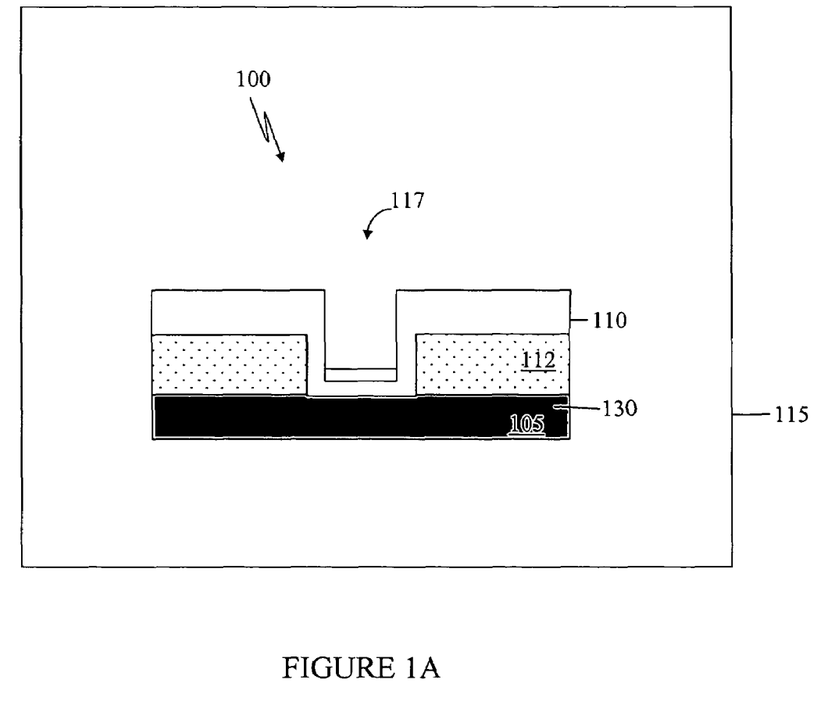
FIGS. 1A to 1D illustrate sectional views of selected steps in a method of forming an exemplary copper layer over a semiconductor substrate according to the principles of the present invention.
Figure 1B:
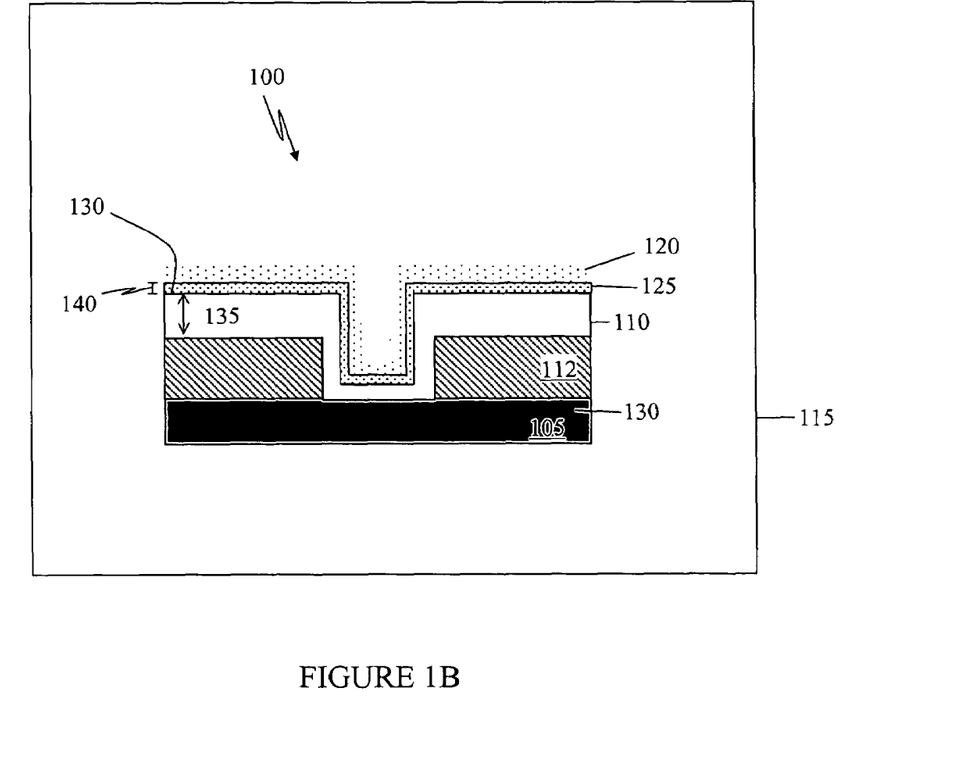
Figure 1C:
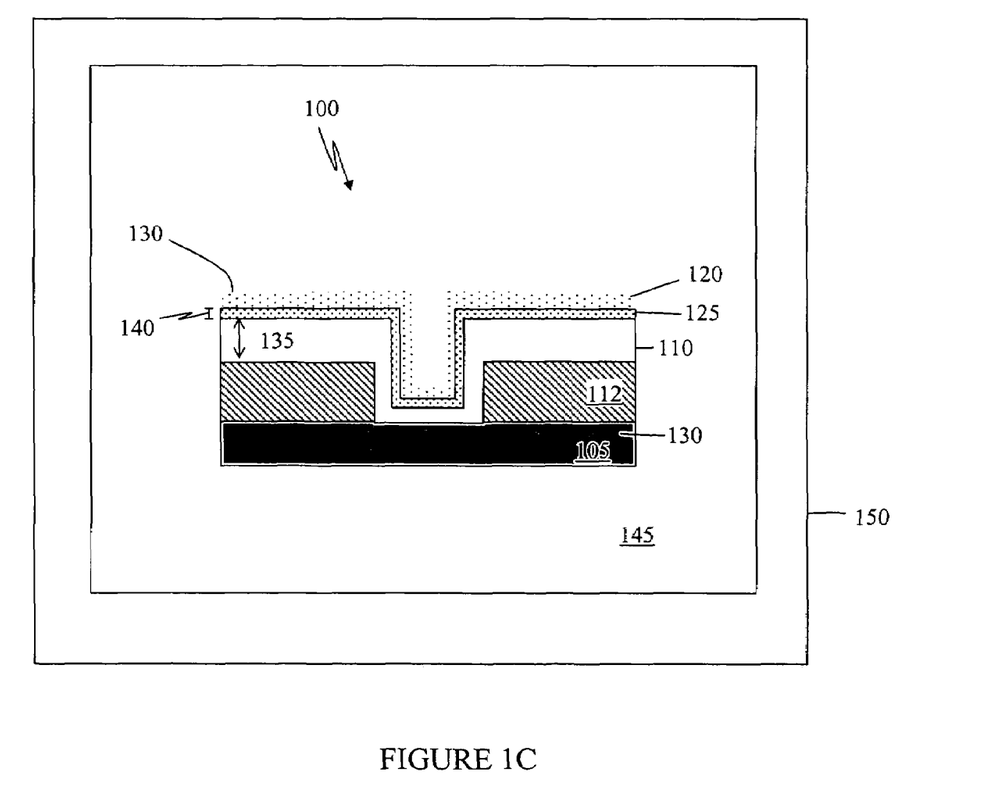

One embodiment of the present invention is a method of forming a copper layer over a semiconductor substrate. Illustrated in FIGS. 1A to 1C, are sectional views of selected steps in the method to form the copper layer 100 according to the principles of the present invention. The copper layer 100 can be an interconnection, a line, via or trench. Turning first to FIG. 1A, illustrated is a semiconductor substrate 105, such as a silicon wafer, after forming a copper seed layer 110 over the semiconductor substrate 105. There can be dielectric layers 112 over the substrate 105 on which the seed layer 110 may be formed. Preferably, the formation of the copper seed layer 110 is carried out in a conventional seed layer deposition tool 115. The tool 115 may include instruments for chemical vapor deposition (CVD), atomic layer deposition (ALD), and more preferably, physical vapor deposition (PVD). These instruments are omitted from the figures for clarity. In some preferred embodiments, the copper seed layer 110 can be formed in an opening 117 as part of a damascene or dual damascene process.

Referring now to FIG. 1B, illustrated is the semiconductor substrate 105 while coating the copper seed layer 110 with a protective agent 120 to form a protective layer 125. In some embodiments, the protective layer 125 can be formed by submerging or coating the seed layer 110 in a protective agent 120 comprising phosphoric acid. The resulting protective layer 125 formed includes a phosphate, such as a phosphate salt, polyphosphoric acid or combination of both phosphate salt and polyphosphoric acid.

As noted above, the protective layer 125 prevents the formation of irregular oxide and AMC deposits on the copper seed layer 110, thereby facilitate a more uniform electrochemical deposition of a second thicker copper layer on the copper seed layer. While not limiting the scope of the invention by theory, it is believed that the protective layer 125 also renders the surface 130 of the protective layer 125 more hydrophilic, which also facilitates a more uniform electrochemical deposition of a second thicker copper layer on the copper seed layer. The presence of the protective layer 125 thereby extends the time window between forming the copper seed layer 110 and a second copper layer. The protective layer 125 is gradually lost, however, possibly due to oxidation.

In the present invention, it was found that the presence of the protective layer 125, and its gradual loss, can be quantified by measure the contact angle of a water droplet on the surface 130. One of ordinary skill in the art would understand how to measure the contact angle using conventional techniques. One of ordinary skill in the art would also understand that a hydrophilic surface has a small contact angle, while a hydrophobic surface has a large contact angle. It was found that as the protective layer 125 was lost, the contact angle of the surface 130 increased from a small value to a large value.

For instance, in some cases where the copper surface 110 is exposed to the protective agent 120 for between about 30 second to about 2 minutes, the surface 130 can have a contact angle of less than about 30 degrees for at least about 16 hours exposure to air. In other cases, where exposure time to the protective agent 120 of between about 25 minutes and 30 minutes is used, the surface 130 is predicted to have a contact angle of less than about 7 degrees for at least about 24 hours exposure to air. For comparison purposes, a copper seed layer 110 that has been exposed to air for about 2 hours, thereby resulting in the formation of irregular oxide and AMC deposits on the copper seed layer 110, has a contact angle of greater than about 40 degrees.

It is advantageous for the protective agent to minimally remove the copper seed layer 110. Maintaining the copper seed layer's thickness 135 can facilitate the deposition of a second thicker copper layer. This, in turn, improves the structural integrity of the copper layer 100, as well as the speed and reliability of transmitting electrical signals through the copper layer 100.

For example, in some embodiments, during coating, the copper seed layer 110 is removed at a rate of less than about 1 nm per minute. In some cases, this is achieved when the protective agent 120 comprise an aqueous phosphoric acid solution adjusted to a particularly effective concentration range. Preferably, the aqueous phosphoric acid solution is between about 0.1 and about 20 weight percent of phosphoric acid. More preferably, the aqueous phosphoric acid solution is between about 15 to about 20 weight percent of phosphoric acid. This concentration range is conducive to a low copper seed layer etch rate.

In some instances, to minimize etching of the copper seed layer 110, it is preferable to limit the layer's 110 exposure to the protective agent 120. For example, in some preferred embodiments, coating includes exposure to an aqueous phosphoric acid solution for between about 30 seconds and about 30 minutes. In some preferred embodiments, for example when using a thin copper seed layer 110, exposure is for between about 30 seconds and about 2 minutes. In other preferred embodiments however, the exposure is for between about 25 minutes and about 30 minutes. As explained above, longer exposures of between about 25 minutes and about 30 minutes can result in a surface 130 having a lower contact angle. However, the desire for a low contact angle has to be balanced against the risk of excessive removal of the copper seed layer 110.

In other embodiments, the protective layer 125 comprises a copper oxide. In such instances, the protective agent 120 comprise hydrogen peroxide. In other cases, the protective agent 120 comprises an oxygen ambient, comprising about 100 percent oxygen maintained at a temperature of between about 25° C. and about 100° C. In still other cases, the protective agent 120 can comprise nitric acid. Advantageously, the thickness 135 of the copper seed layer 110 after exposure to the protective agent 120 is substantially the same as compared to a freshly deposited copper seed layer, for example within 5 minutes of the substrate's 105 removal from a copper seed layer depositing tool. In such embodiments, it is also advantageous for the protective layer 125 to be thin and have a uniform thickness 140. For instances, in some cases, the protective layer has a thickness 140 of between about 5 and about 2 nm with a variation in thickness of less than about ±10 percent. While not limiting the scope of the invention by theory, it is believed that using a thin uniform protective layer 125 prevents the formation of irregular oxide deposits and AMC deposits on the copper seed layer 110, and at the same time, being readily and uniformly removable in subsequent steps discussed below. This, in turn, provides a surface 130 that is substantially free of the irregular oxide and AMC deposits, thereby facilitating the uniform deposition of a second copper layer via electrochemical deposition.

Turning now to FIG. 1C, illustrated is the semiconductor substrate 105, after placing it in an acid bath 145, to remove the protective layer 125. For example, when the protective layer 125 is a copper oxide layer, it is desirable to remove the protective layer before the electrochemical deposition of copper, further discussed below. In other cases, as illustrated, the acid bath 145 can be an electrochemical deposition bath used in an ECD tool 150 for electrochemically depositing copper. For example, when the protective layer comprises a phosphate, then the semiconductor substrate 105 can be placed in the electrochemical deposition bath used in the ECD tool 150. In such instances, the acid bath 145 preferably comprises conventional materials used in the electrochemical deposition of copper, such as sulphuric acid and copper sulfate in water. Alternatively, the acid bath 145 can be separate from the ECD tool 150. In such cases, the acid bath 145 can simply include a strong acid, such as sulphuric acid, in sufficient concentration, to remove the protective layer 125. However, there can also be multiple exposures to the acid bath 145, or to different baths, before and during placement of the semiconductor substrate 105 in the ECD tool 150.

As noted above, during the time window between transferring of the semiconductor substrate 105 from the seed layer deposition tool 115 (shown in FIG. 1A) to the ECD tool 150, oxide or AMC deposits can form on the copper seed layer 110. In the present invention, forming the protective layer 125 on the copper seed layer 110 substantially extends the allowable time window. For instance, in some cases the time window between coating the copper seed layer 110 with the protective agent 120 to form the protective layer 125 and electrochemically depositing is between about 2 and about 24 hours.

Figure 1D:
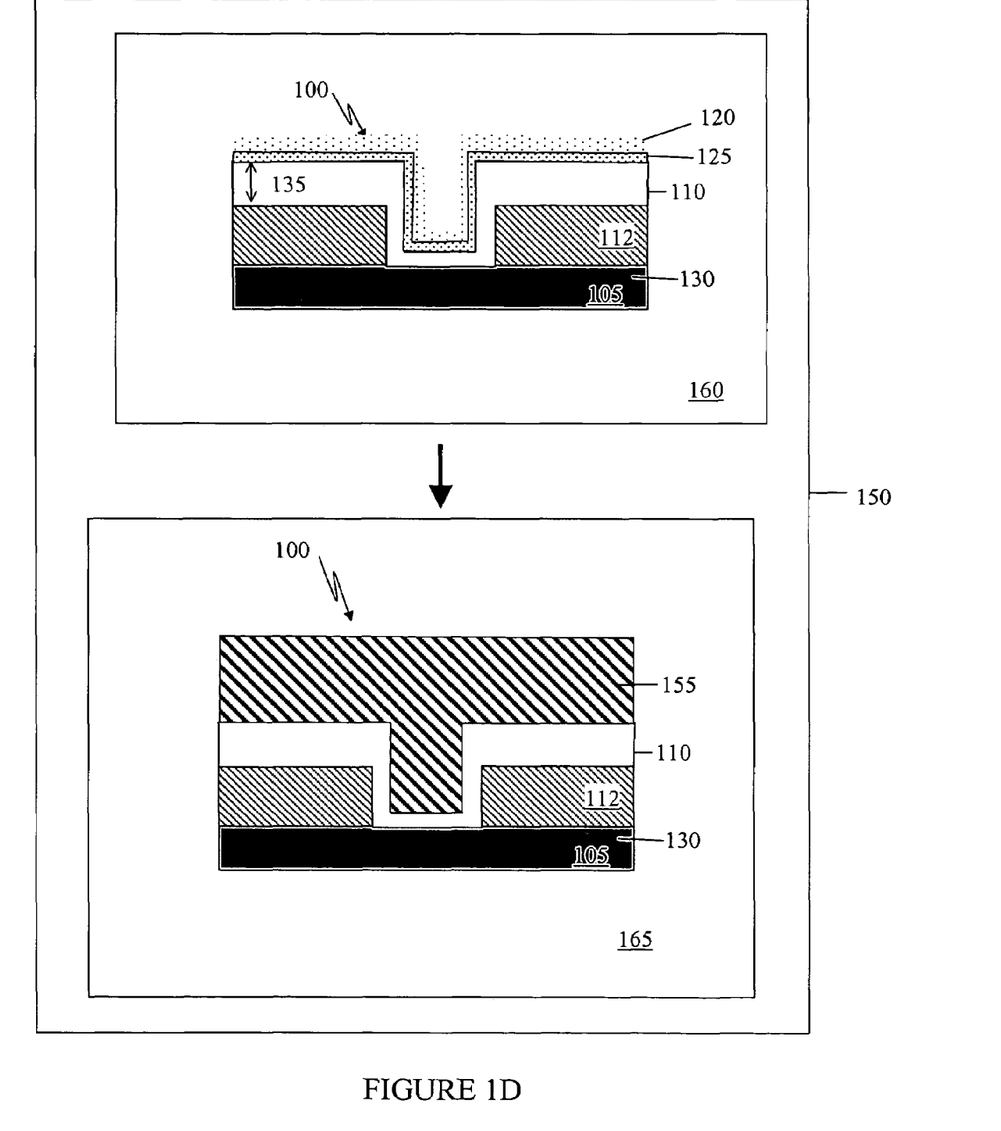

Turning now to FIG. 1D, illustrated is the semiconductor substrate 105, after electrochemically depositing a second copper layer 155 on the copper seed layer 110. Any conventional ECD techniques or tools 150 can be used. As further illustrated in FIG. 1D, in some cases, coating the copper seed layer 110 with the protective layer 125 and electrochemical deposition of the copper are conducted in the same deposition tool 150. As an example, electrochemical deposition of the second copper layer 155 can be performed using a multi-chambered conventional ECD tool 150, wherein each chamber of the ECD tool 150 is schematically represented by the inset boxes in which the sectional views are located. Preferably, the ECD tool 150 includes a spin-rinse drying chamber 160 and an electrochemical depositing or plating chamber 165. It is advantageous to coat the copper seed layer 110 with the protective agent 120 in the same chamber 160 as used for drying the semiconductor substrate 105. For example, the protective agent 120 can occur while the semiconductor substrate 105 is in the spin rinse drying (SRD) chamber 160.

In certain embodiments, coating with the protective agent 120 is preferably done immediately before drying and moving the semiconductor substrate 105 into the electrochemical depositing chamber 165. It is advantageous for the coating and the electrochemical deposition of the second copper layer 155 to be carried out in the same tool to minimize oxide or AMC deposits from forming on the copper seed layer 110. In such embodiments, for instance, the copper seed layer's 110 exposure to an oxidizing atmosphere can be less than about 1 minute.

In still other embodiments, coating with the protective agent 120, as described above, is done on a copper seed layer 110 having AMCs or oxides formed thereon. As explained above, AMCs or irregular oxide deposits can form on the copper seed layer 110 when there is an extended period between forming the copper seed layer 110 and transferring the semiconductor substrate 105 into the ECD tool 150. Coating with the protective agent 120 removes the AMCs or oxide deposits, and results in the formation of the protective layer 125. The semiconductor substrate 105 is thus recovered for subsequent deposition of the electrochemically depositing a second copper layer 155 on the copper seed layer 110, as described above. Moreover coating with the protective agent 120 can be repeated several times, if necessary, to prepare the copper seed layer 110 for deposition with the second copper layer 155.

Figure 2A:
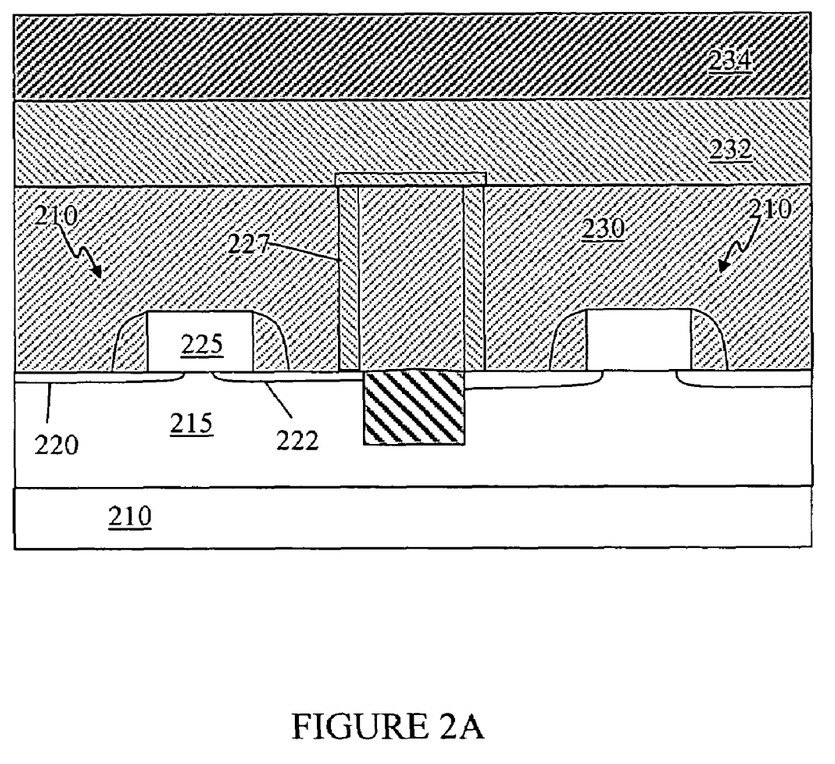
FIGS. 2A to 2D illustrate sectional views of selected steps in a method of making an exemplary integrated circuit according to the principles of the present invention.

FIGS. 2A–2D illustrate another aspect of the present invention, a method of manufacturing an integrated circuit 200 at select stages of fabrication. Any of the above-described embodiments, may be applied to the method of manufacturing the integrated circuit 200. FIG. 2A illustrates the exemplary integrated circuit 200 after forming an active device 205 over a semiconductor substrate 210. Of course, any number of active devices, comprising any conventional transistor or transistors, such as a MOS transistor, can be formed over or in the semiconductor substrate 210. The active device 205 can include conventional integrated circuit components, such as MOS components like a doped region 215, source/drain regions, 220, 222 and gate structure 225. FIG. 2A also shows the integrated circuit 200 after forming one or more conventional dielectric layers 230, 232, 234 over the active device 205.

Figure 2B:
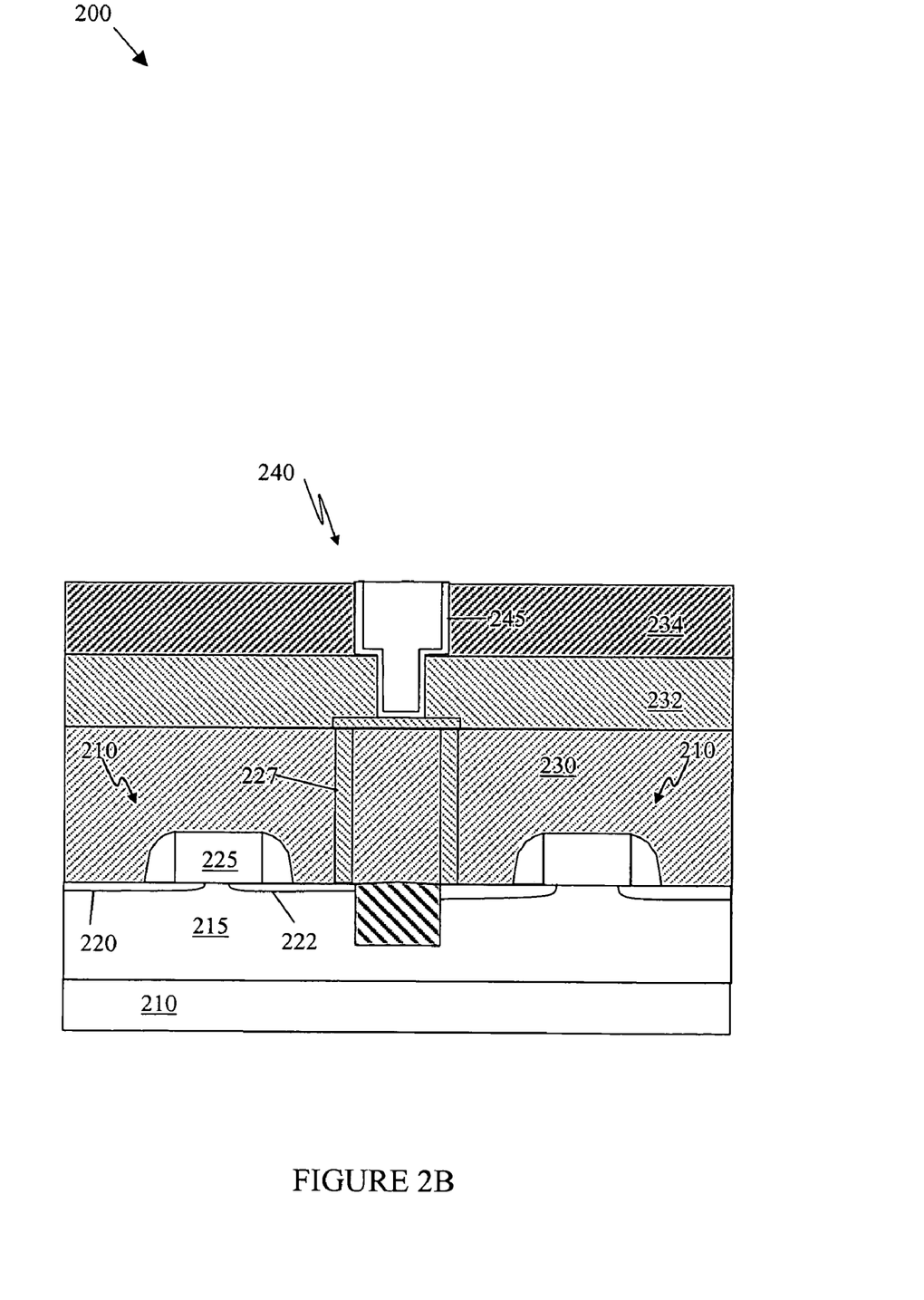

Turing now to FIG. 2B, shown is the integrated circuit 200 after forming an opening 227 in the dielectric layers 230, 232, 234 using conventional lithographic techniques as a step in forming a copper interconnect 240 over, on or in the dielectric layers 230, 232, 234. The copper interconnect 240 could be any conventional interconnect structure including lines, vias and trenches. FIG. 2B also shows the integrated circuit 200 after the additional step of forming the copper interconnect 240 and forming a copper seed layer 245 over the semiconductor substrate 210.

Figure 2C:
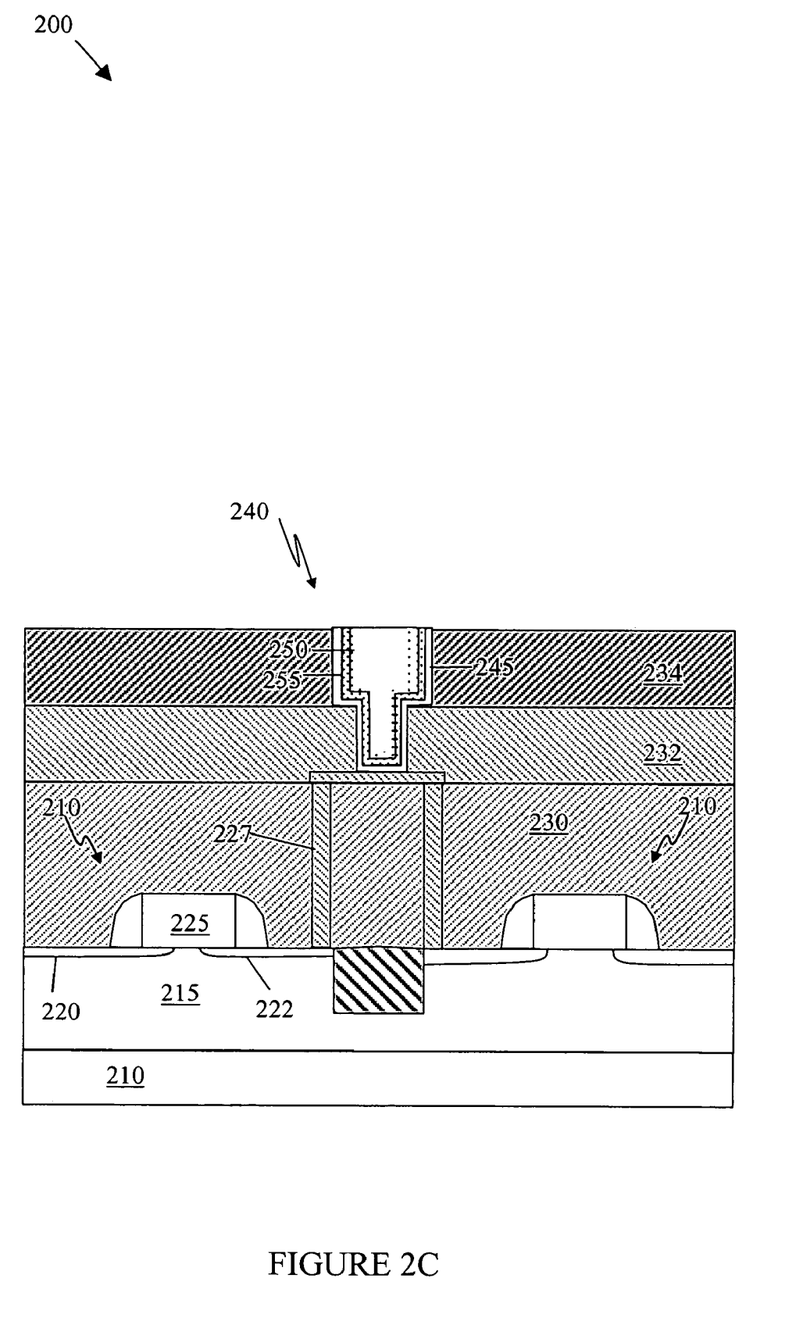

Turning now to FIG. 2C, illustrated is the integrated circuit 200 during the step of forming the copper interconnect 240 by coating the copper seed layer 245 with a protective agent 250 to form a protective layer 255. Any of the above-describe procedures and structures could be used to form the protective agent 250 and the protective layer 255. For instances, in some preferred embodiments, during coating, the copper seed layer 245 is removed at a rate of less than about 1 nm per minute. In other preferred embodiments, the protective layer-coated copper seed layer 245 has a contact angle as described above. In still other preferred embodiments, the protective agent 250 is an aqueous phosphoric acid solution, having the composition described above, and the protective layer 255 comprises a phosphate. In yet other preferred embodiments, the protective agent 250 is an aqueous hydrogen peroxide solution, and the protective layer 255 comprises copper oxide having the thickness and uniformity described above.

Figure 2D:
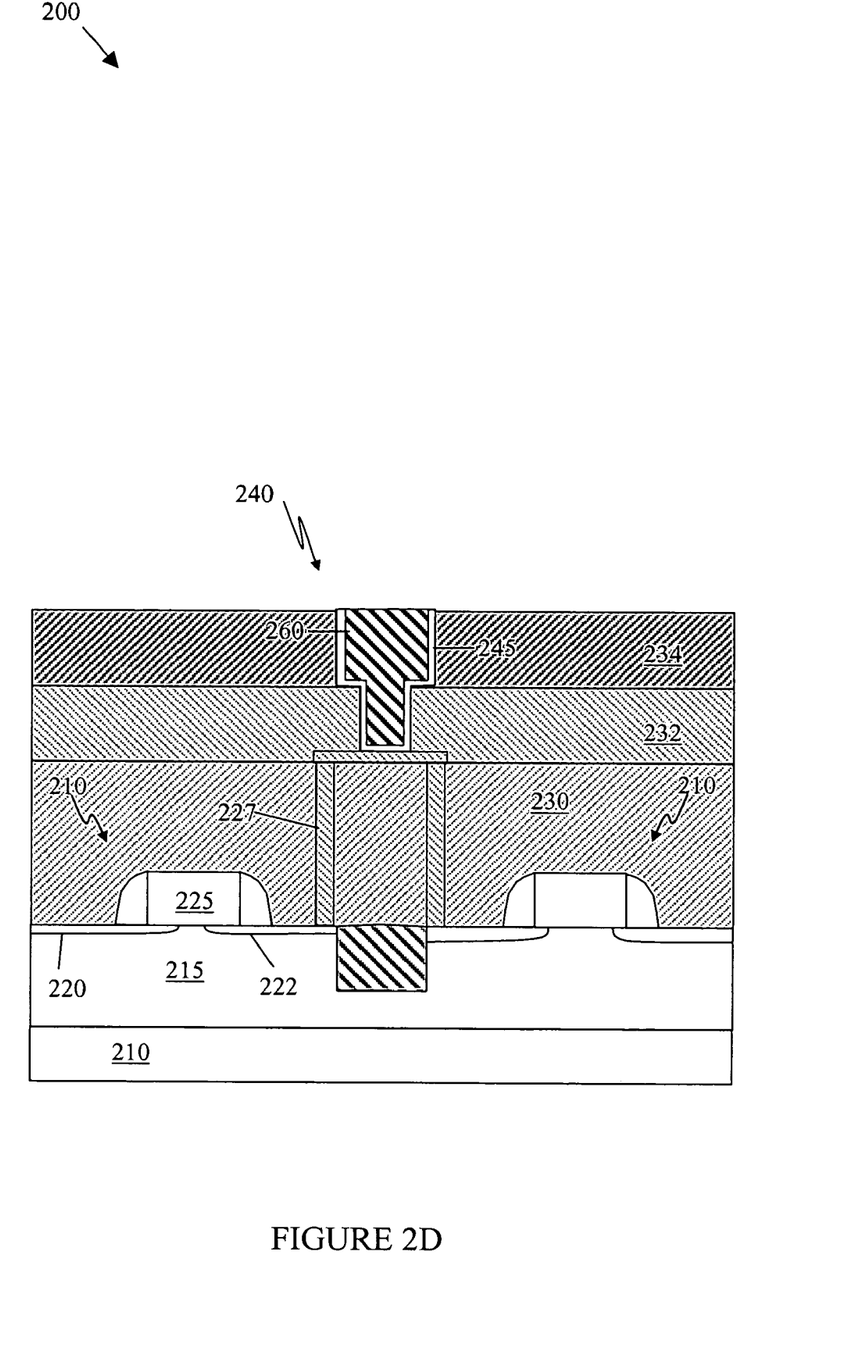

Referring now to FIG. 2D, illustrated is the integrated circuit 200 after placing the semiconductor substrate 210 in an acid bath, such as described above, to remove the protective layer 255 (shown in FIG. 2C), and after electrochemically depositing a second copper layer 260 on the copper seed layer 245, to form the copper interconnect 240. Of course, forming the copper interconnect line 240 could further include any number of conventional steps, including forming barrier layers of tantalum, tantalum nitride, or both. One of ordinary skill would also understand that the method may further be extended to form any number of additional interconnects located over the copper interconnect 240, and would understand how to connect those interconnects with the active devices to form an operative integrated circuit.

Although the present invention has been described in detail, one of ordinary skill in the art should understand that they can make various changes, substitutions and alterations herein without departing from the scope of the invention.

What is claimed is:

1. A method of forming a copper layer over a semiconductor wafer, comprising:
   coating a copper seed layer located over a semiconductor substrate with a protective agent to form a protective layer;
   placing said semiconductor substrate in an acid bath to remove said protective layer; and
   electrochemically depositing a second copper layer on said copper seed layer.

2. The method as recited in claim 1, wherein during said coating said copper seed layer is removed at a rate of less than about 1 nm per minute.

3. The method as recited in claim 1, wherein said protective layer-coated copper seed layer has a contact angle of less than about 30 degrees for at least about 16 hours exposure to air.

4. The method as recited in claim 1, wherein said protective agent is an aqueous phosphoric acid solution.

5. The method as recited in claim 4, wherein said aqueous phosphoric acid solution is between about 0.1 and about 20 weight percent phosphoric acid.

6. The method as recited in claim 4, wherein said coating includes exposure to said aqueous phosphoric acid solution for between about 30 seconds and about 30 minutes.

7. The method as recited in claim 1, wherein said protective agent is hydrogen peroxide, an oxygen ambient, or nitric acid.

8. The method as recited in claim 7, wherein said protective layer is a copper oxide having a thickness of between about 5 and about 2 nm and a variation in thickness of less than about ±10 percent.

9. The method as recited in claim 1, wherein said acid bath is an electrochemical deposition bath used for said electrochemically depositing.

10. The method as recited in claim 1, wherein said placing and said electrochemical depositing are conducted in a same deposition tool.

11. The method as recited in claim 1, wherein said placing is conducted prior to placing said semiconductor substrate in an electrochemical deposition tool.

12. The method as recited in claim 1, further including a time window between said coating and said electrochemically depositing, of between about 2 and about 24 hours.

13. The method as recited in claim 1, wherein coating with said protective agent removes atmospheric molecular contaminants or oxide deposits on said copper seed layer.

14. A method of manufacturing an integrated circuit comprising:
   forming an active device over or in a semiconductor substrate;
   forming an copper interconnect copper on a dielectric layer located over said active device including:
      coating a copper seed layer located over a semiconductor substrate with a protective agent to form a protective layer,
      placing said semiconductor substrate in an acid bath to remove said protective layer; and
      electrochemically depositing a second copper layer on said copper seed layer; and
   connecting said copper interconnect with said active devices to form an operative integrated circuit.

15. The method as recited in claim 14, wherein during said coating said copper seed layer is removed at a rate of less than about 1 nm per minute.

16. The method as recited in claim 14, wherein said protective layer-coated copper seed layer has a contact angle of less than about 30 degrees for at least about 16 hours exposure to air.

17. The method as recited in claim 14, wherein said protective agent is an aqueous phosphoric acid solution and said protective layer comprises a phosphate.

18. The method as recited in claim 17, wherein said aqueous phosphoric acid solution is between about 0.1 and about 20 weight percent phosphoric acid.

19. The method as recited in claim 17, wherein said coating includes exposure to said aqueous phosphoric acid solution for between about 30 seconds and about 30 minutes.

20. The method as recited in claim 14, wherein said protective agent is hydrogen peroxide.

21. The method as recited in claim 20, wherein said protective layer is a copper oxide having a thickness of between about 5 and about 2 nm and a variation in thickness of less than about ±10 percent.

* * * * *